(12) United States Patent
Matsuo et al.

(10) Patent No.: US 8,473,096 B2
(45) Date of Patent: Jun. 25, 2013

(54) SUBSTRATE TRANSFER ROBOT, SUBSTRATE TRANSFER DEVICE, SEMICONDUCTOR MANUFACTURING APPARATUS, AND METHOD FOR PRODUCING SEMICONDUCTOR

(75) Inventors: Mitsuaki Matsuo, Fukuoka (JP); Yoshiki Kimura, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 582 days.

(21) Appl. No.: 12/704,538

(22) Filed: Feb. 12, 2010

(65) Prior Publication Data
US 2010/0209225 A1 Aug. 19, 2010

(30) Foreign Application Priority Data
Feb. 13, 2009 (JP) ................. 2009-031130

(51) Int. Cl.
*H01L 21/677* (2006.01)
(52) U.S. Cl.
USPC ........................... 700/229; 700/121; 700/245
(58) Field of Classification Search
USPC ....................................................... 700/229
See application file for complete search history.

(56) References Cited

U.S. PATENT DOCUMENTS

| | | | |
|---|---|---|---|
| 6,216,058 B1 * | 4/2001 | Hosek et al. ................. | 700/245 |
| 6,643,563 B2 * | 11/2003 | Hosek et al. ................. | 700/245 |
| 2003/0108415 A1 * | 6/2003 | Hosek et al. ................. | 414/783 |
| 2004/0249509 A1 * | 12/2004 | Rogers et al. ................. | 700/245 |
| 2005/0011294 A1 * | 1/2005 | Hashimoto et al. ........ | 74/490.01 |
| 2006/0182536 A1 * | 8/2006 | Rice et al. .................... | 414/217 |

FOREIGN PATENT DOCUMENTS

| | | |
|---|---|---|
| JP | 2000-174092 | 6/2000 |
| JP | 2005-509277 | 4/2005 |
| WO | WO 03/007129 | 1/2003 |

OTHER PUBLICATIONS

Japanese Office Action for corresponding JP Application No. 2009-031130, Nov. 20, 2012.

* cited by examiner

*Primary Examiner* — Gene Crawford
*Assistant Examiner* — Kyle Logan
(74) *Attorney, Agent, or Firm* — Ditthavong Mori & Steiner, P.C.

(57) ABSTRACT

A substrate transfer robot includes a substrate gripping portion, an arm unit, and a controller. The substrate gripping portion is configured to hold a substrate. The arm unit includes a plurality of arms which are capable of turning in a horizontal plane. The arm unit has the substrate gripping portion at a leading end of the arm unit and is configured to transfer the substrate between a plurality of taught positions taught beforehand. When the taught positions are taught, the controller is configured to generate an access standby position corresponding to each of the plurality of taught positions and configured to generate and store a plurality of routes from the access standby position to a minimum turning posture of the substrate transfer robot.

17 Claims, 10 Drawing Sheets

SUBSTRATE TRANSFER ROBOT, SUBSTRATE TRANSFER DEVICE, SEMICONDUCTOR MANUFACTURING APPARATUS, AND METHOD FOR PRODUCING SEMICONDUCTOR

CROSS-REFERENCE TO RELATED APPLICATIONS

The present invention relates to Japanese Patent Application No. 2009-031130, filed Feb. 13, 2009. The contents of this application are incorporated herein by reference in their entirety.

BACKGROUND OF THE INVENTION

1. Field of the Invention

The present invention relates to a substrate transfer robot, a substrate transfer device, a semiconductor manufacturing apparatus, and a method for producing a semiconductor.

2. Discussion of the Background

A substrate transfer robot has hitherto been used to transfer a substrate (a semiconductor wafer or a mask) to a desired position in a manufacturing apparatus and a testing apparatus for a semiconductor (hereinafter generically referred to as a semiconductor manufacturing apparatus). The substrate transfer robot includes an arm unit formed by a plurality of arms connected in a manner such as to be turnable on a horizontal plane, and a substrate gripping portion, called a hand or a fork, provided at a leading end of the arm unit. A substrate is transferred to a desired position while being placed on the substrate gripping portion.

In the substrate transfer robot of the related art, when a substrate is moved from a taught position taught beforehand to another taught position (target position), a path connecting the taught positions is generated as a transfer route to the target position on the basis of information about the taught positions, a transit point, and the minimum turning posture. That is, positions to which the substrate transfer robot transfers the substrate, such as positions of a storage container or a treatment device for the substrate, are taught, and one transfer route from a certain point to a certain target point is generated. Using this transfer route, the substrate is transferred between a storage container and a treatment device or between treatment devices.

Unfortunately, in the semiconductor manufacturing apparatus that needs to shorten the substrate transfer time between the storage container and the treatment device or between the treatment devices, when the substrate transfer robot is used with the highest possible performance (the turning speed of the arm is nearly at the limit and the transfer speed is thereby nearly at the limit), the substrate transfer time is further shortened by adjusting the taught positions or adjusting information about generation of the transit point in the related art (for example, see Japanese Unexamined Patent Application Publication No. 2000-174092).

SUMMARY OF THE INVENTION

According to one aspect of the present invention, a substrate transfer robot includes a substrate gripping portion, an arm unit, and a controller. The substrate gripping portion is configured to hold a substrate. The arm unit includes a plurality of arms which are capable of turning in a horizontal plane. The arm unit has the substrate gripping portion at a leading end of the arm unit and is configured to transfer the substrate between a plurality of taught positions taught beforehand. When the taught positions are taught, the controller is configured to generate an access standby position corresponding to each of the plurality of taught positions and configured to generate and store a plurality of routes from the access standby position to a minimum turning posture of the substrate transfer robot.

According to another aspect of the present invention, a substrate transfer device includes a substrate transfer robot and at least two substrate storage containers. The substrate transfer robot includes a substrate gripping portion, an arm unit, and a controller. The substrate gripping portion is configured to hold a substrate. The arm unit includes a plurality of arms which are capable of turning in a horizontal plane. The arm unit has the substrate gripping portion at a leading end of the arm unit and is configured to transfer the substrate between a plurality of taught positions taught beforehand. When the taught positions are taught, the controller is configured to generate an access standby position corresponding to each of the plurality of taught positions and configured to generate and store a plurality of routes from the access standby position to a minimum turning posture of the substrate transfer robot. The at least two substrate storage containers are configured to store the substrate. Positions of the at least two substrate storage containers are taught as the taught positions. The substrate is transferred between the at least two substrate storage containers.

According to still another aspect of the present invention, a semiconductor manufacturing apparatus includes a substrate transfer robot, at least one substrate storage container, and at least one treatment device. The substrate transfer robot includes a substrate gripping portion, an arm unit, and a controller. The substrate gripping portion is configured to hold a substrate. The arm unit includes a plurality of arms which are capable of turning in a horizontal plane. The arm unit has the substrate gripping portion at a leading end of the arm unit and is configured to transfer the substrate between a plurality of taught positions taught beforehand. When the taught positions are taught, the controller is configured to generate an access standby position corresponding to each of the plurality of taught positions and configured to generate and store a plurality of routes from the access standby position to a minimum turning posture of the substrate transfer robot. The at least one substrate storage container is configured to store the substrate. The at least one treatment device is configured to treat the substrate. Positions of the at least one substrate storage container and the at least one treatment device are taught as the taught positions. The substrate is transferred between the at least one substrate storage container and the at least one treatment device.

According to further aspect of the present invention, a method for producing a semiconductor includes holding a substrate with a substrate gripping portion of a substrate transfer robot, transferring the substrate between a plurality of taught positions taught beforehand, generating an access standby position corresponding to each of the plurality of taught positions when the taught positions are taught, and generating a plurality of routes from the access standby position to a minimum turning posture of the substrate transfer robot.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Embodiments will now be described with reference to the accompanying drawings, wherein like reference numerals designate corresponding or identical elements throughout the various drawings.

Figure 1:
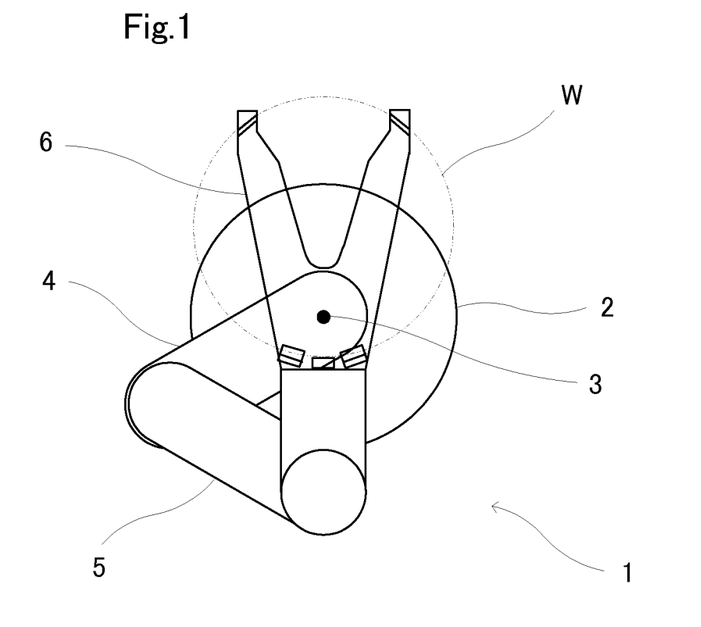
FIG. 1 is a plan view showing a structure of a substrate transfer robot according to an embodiment of the present invention.

An embodiment of the present invention will be described below with reference to the drawings. FIG. 1 is a plan view of a substrate transfer robot of the embodiment having a transfer-route generating function and a shortest-route selecting function. Referring to FIG. 1, W represents a substrate to be transferred. A horizontal articulated substrate transfer robot 1 includes a columnar support 2 serving as a body that is movable up and down in the vertical direction and is shaped like a circular column or a rectangular column. The substrate transfer robot 1 also includes a first arm 4 that turns on a turn center 3 relative to the columnar support 2 in a horizontal plane, a second arm 5 attached to a leading end of the first arm 4 in a manner such as to turn in a horizontal plane, and a substrate gripping portion 6 attached to a leading end of the second arm 5 in a manner such as to turn in a horizontal plane. The substrate gripping portion 6 is a Y-shaped hand on which the substrate W is to be placed. The first arm 4 can turn to an arbitrary position relative to the columnar support 2 by a motor (not shown). Similarly, the second arm 5 can turn to an arbitrary position relative to the first arm 4 by a motor (not shown), and the substrate gripping portion 6 can turn to an arbitrary position relative to the second arm 5 by a motor (not shown). The substrate transfer robot 1 is connected to a controller (not shown), and transfers the substrate W to a target position while following a transfer route generated from a taught position prestored in the controller.

Figure 2:
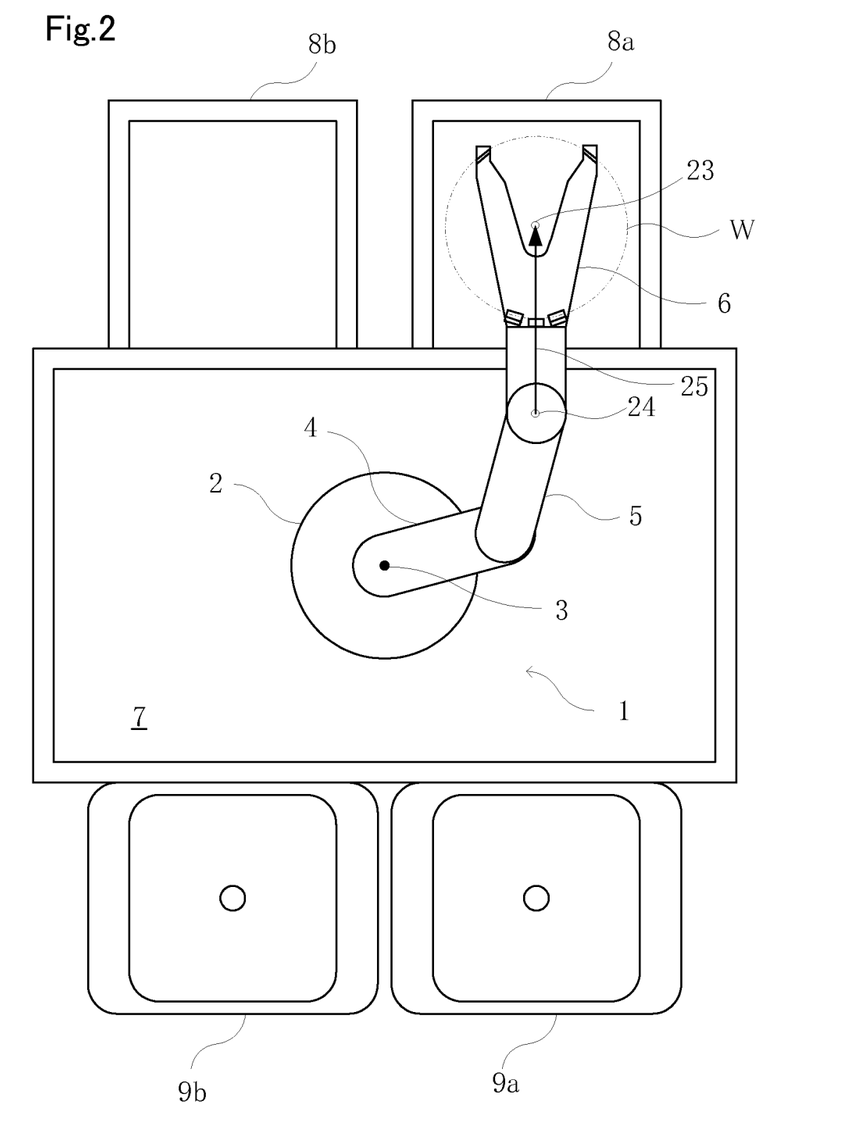
FIG. 2 shows an exemplary layout of a semiconductor manufacturing apparatus using the substrate transfer robot shown in FIG. 1.

FIG. 2 is a plan view showing an exemplary layout of a semiconductor manufacturing apparatus (apparatus) 7 using the substrate transfer robot 1 shown in FIG. 1. The substrate transfer robot 1 is located at almost the center of the apparatus 7, and receives and delivers the substrate W by causing the substrate gripping portion 6 to access two storage containers 8a and 8b for storing the substrate W or substrate treatment devices 9a and 9b for performing treatment operations for semiconductor manufacturing. The treatment operations are known operations such as etching, CVD, cleaning, and exposure.

FIGS. 3 to 6 show substrate transfer routes of the substrate transfer robot 1 between an origin position 13 and a taught position 10 taught for access to the storage container 8a shown in FIG. 2.

An access standby position 11 is generated from the taught position 10, and corresponds to a position of the substrate transfer robot 1 where the substrate transfer robot 1 is ready to immediately start carriage of the substrate W into or out of the storage container 8a, from which the substrate transfer robot 1 can directly carry the substrate W into and out of the storage container 8a. The access standby position 11 is common to FIGS. 3 to 6, and the postures of the arms 4 and 5 and the substrate gripping portion 6 of the substrate transfer robot 1 are also common thereto. While the access standby position 11 for the storage container 8a is described here, access standby positions are also provided for taught positions to and from which the substrate W is to be delivered and received, including the storage container 8b and the treatment devices 9a and 9b shown in FIG. 2. The access standby positions are where the substrate gripping portion 6 and the substrate W do not interfere with the taught positions, and where the substrate transfer robot 1 is ready to immediately start delivery and receiving of the substrate W.

At the origin position 13, the arms 4 and 5 and the substrate gripping portion 6 define the minimum turning posture, and the leading end of the substrate gripping portion 6 points leftward in the figure. The term "minimum turning posture" refers to a posture that minimizes the turning radius two-dimensionally needed when the posture defined by the arms 4 and 5 and the substrate gripping portion 6 is turned on the turn center 3.

A transfer-route generating function of the embodiment will now be described.

When the taught position 10 is taught as a position where the substrate W is to be delivered to the storage container 8a, as shown in FIGS. 3 to 6, the controller (not shown) of the substrate transfer robot 1 generates the access standby position 11, and simultaneously generates a plurality of safe transfer routes from the storage container 8a to the position of the minimum turning posture. The term "safe transfer route" refers to a transfer route such that the substrate gripping portion 6 and the substrate W do not touch the storage container 8a during access to the storage container 8a.

In this case, the controller generates the following four transfer routes as the transfer routes from the access standby position 11 serving as the transit point to the position of the minimum turning posture.

For the purpose of explanation, the center position of the substrate W gripped by the substrate gripping portion 6 is referred to as a substrate center 23, as shown in FIG. 2. Further, the turn center of the substrate gripping portion 6 is referred to as a substrate-gripping-portion turn center 24, and a straight line connecting the substrate-gripping-portion turn center 24 and the substrate center 23 is referred to as a substrate-gripping-portion vector 25.

Figure 3:
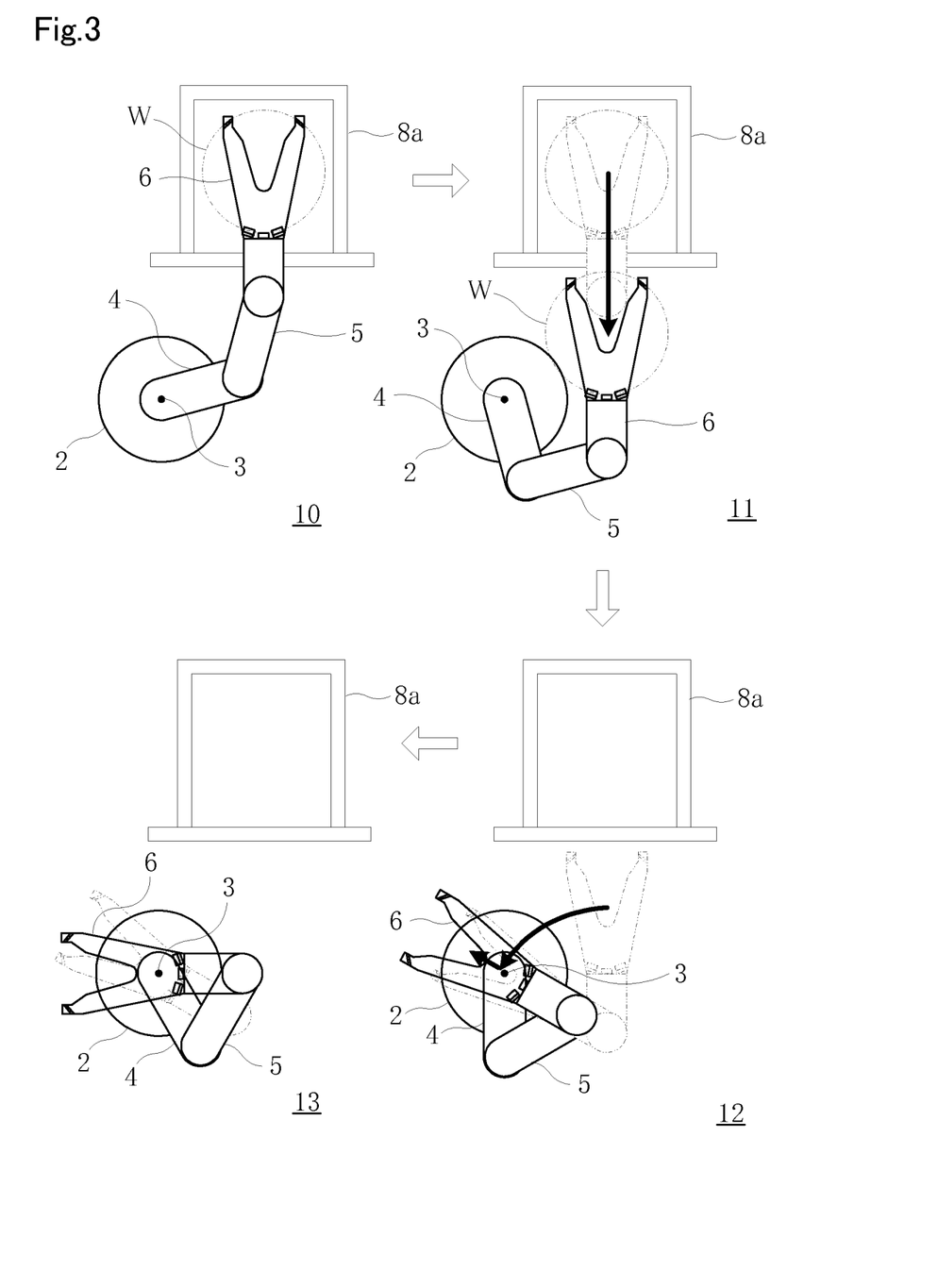
FIG. 3 shows a first substrate transfer route between a taught position and an origin position.

As shown in FIG. 3, a first transfer route is such that the substrate gripping portion 6 moves from the access standby position 11 to the minimum turning posture (referred to as a minimum turning A-posture 12) while maintaining the vector direction of a straight line connecting the turn center 3 of the substrate transfer robot 1 and the substrate-gripping-portion turn center 24. In this case, after the substrate gripping portion 6 is turned in a direction such that the substrate-grippingportion vector 25 passes through the turn center 3, it is moved to the minimum turning posture.

Figure 4:
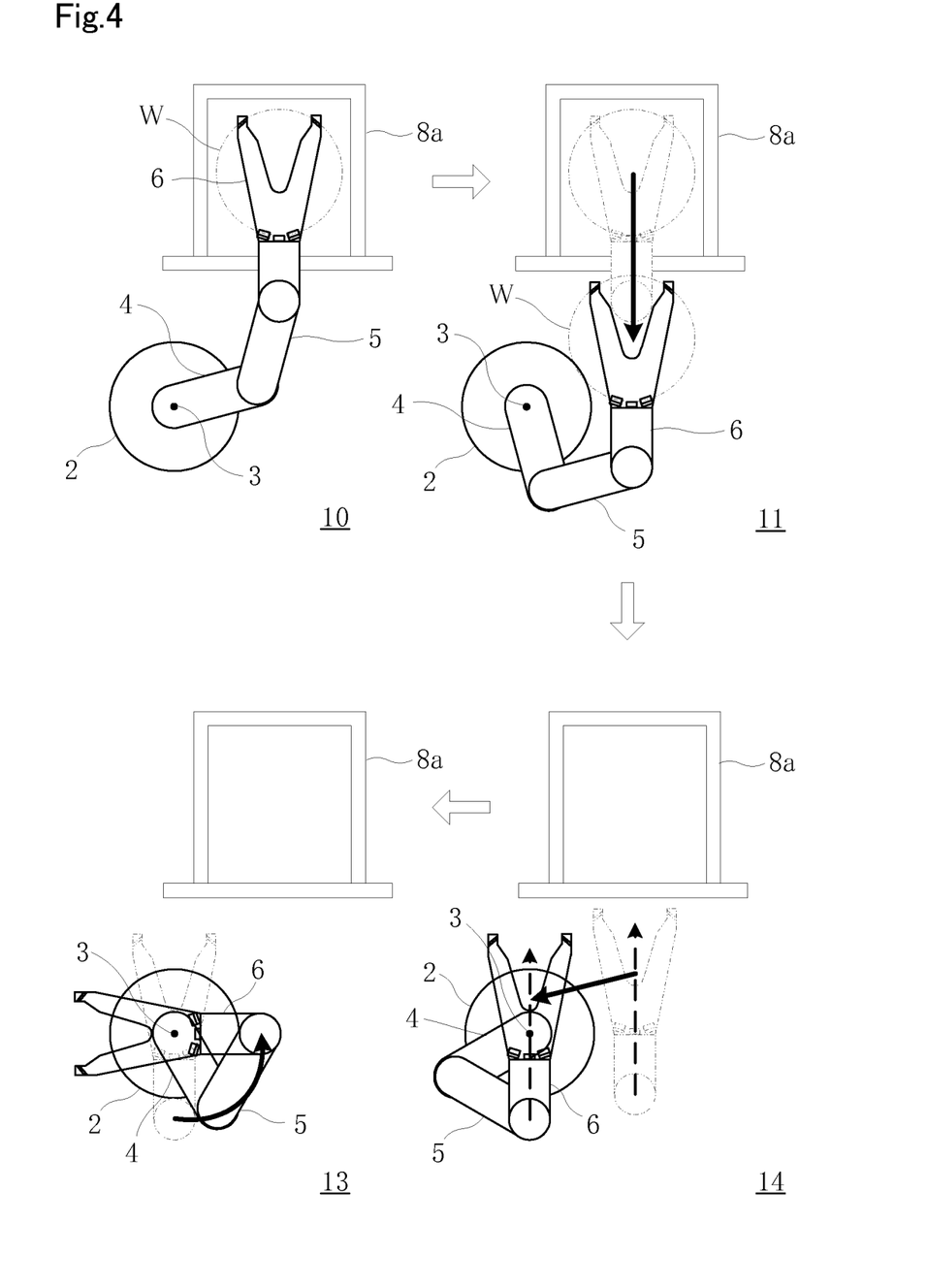
FIG. 4 shows a second substrate transfer route between the taught position and the origin position.

As shown in FIG. 4, a second transfer route is such that the substrate gripping portion 6 moves from the access standby position 11 to the minimum turning posture (referred to as a minimum-turning B-posture 14) while maintaining the substrate-gripping-portion vector 25. In this case, the substrate gripping portion 6 simultaneously moves from the access standby position 11 to a position where the substrate-gripping-portion vector 25 passes through the turn center 3 and the minimum turning posture is taken while maintaining the direction of the substrate-gripping-portion vector 25.

Figure 5:
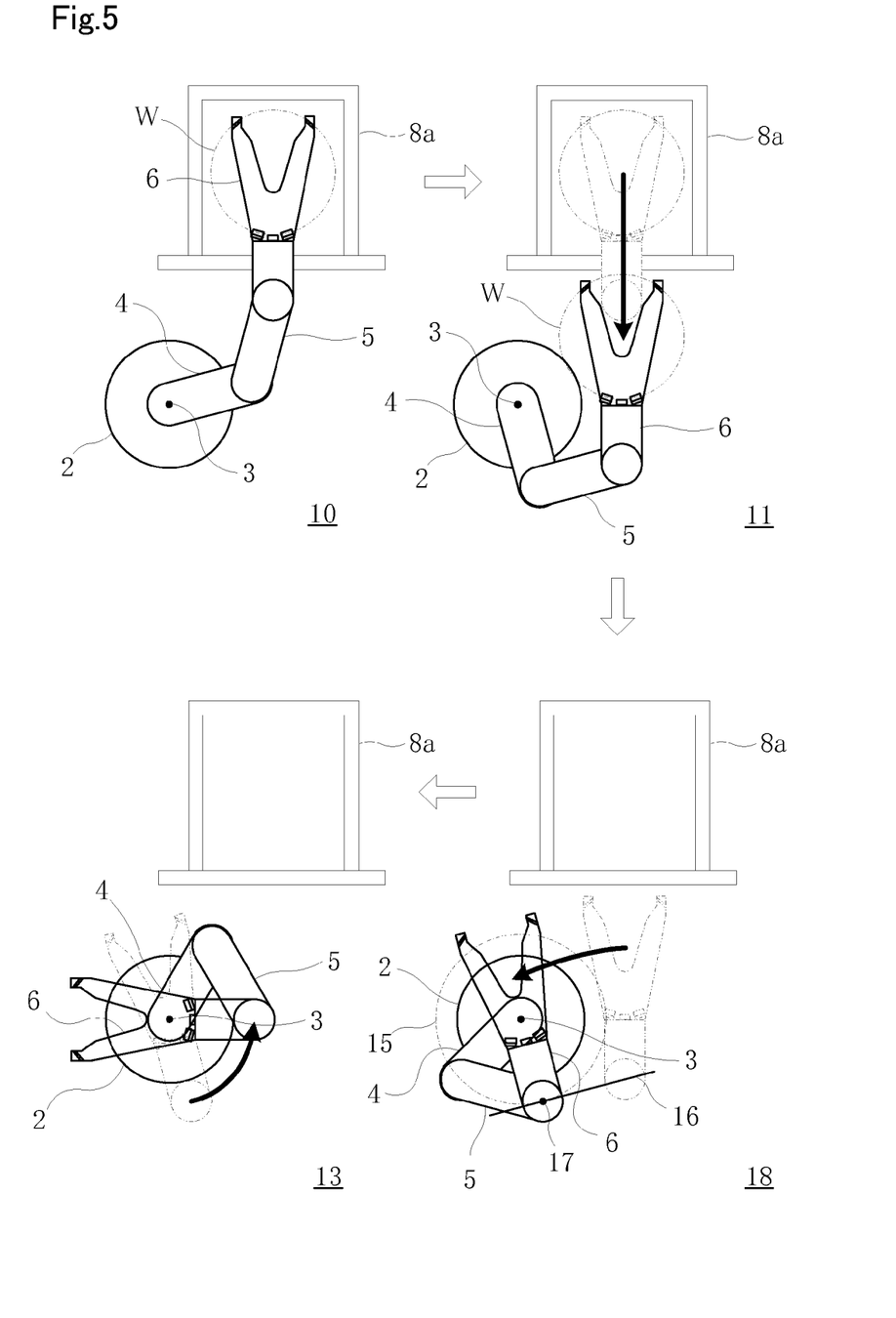
FIG. 5 shows a third substrate transfer route between the taught position and the origin position.

As shown in FIG. 5, a third transfer route is such that the substrate-gripping-portion turn center 24 moves along a straight line 16 connecting the substrate-gripping-portion turn center 24 at the access standby position 11 and the closest contact point 17 in contact with a locus 15 of the substrate-gripping-portion turn center 24 made when the substrate transfer robot 1 is turned in the minimum turning posture, and such that the substrate gripping portion 6 moves to the minimum turning posture (referred to as a minimum-turning C-posture 18) by turning so that the substrate-gripping-portion vector 25 passes through the robot turn center 3.

Figure 6:
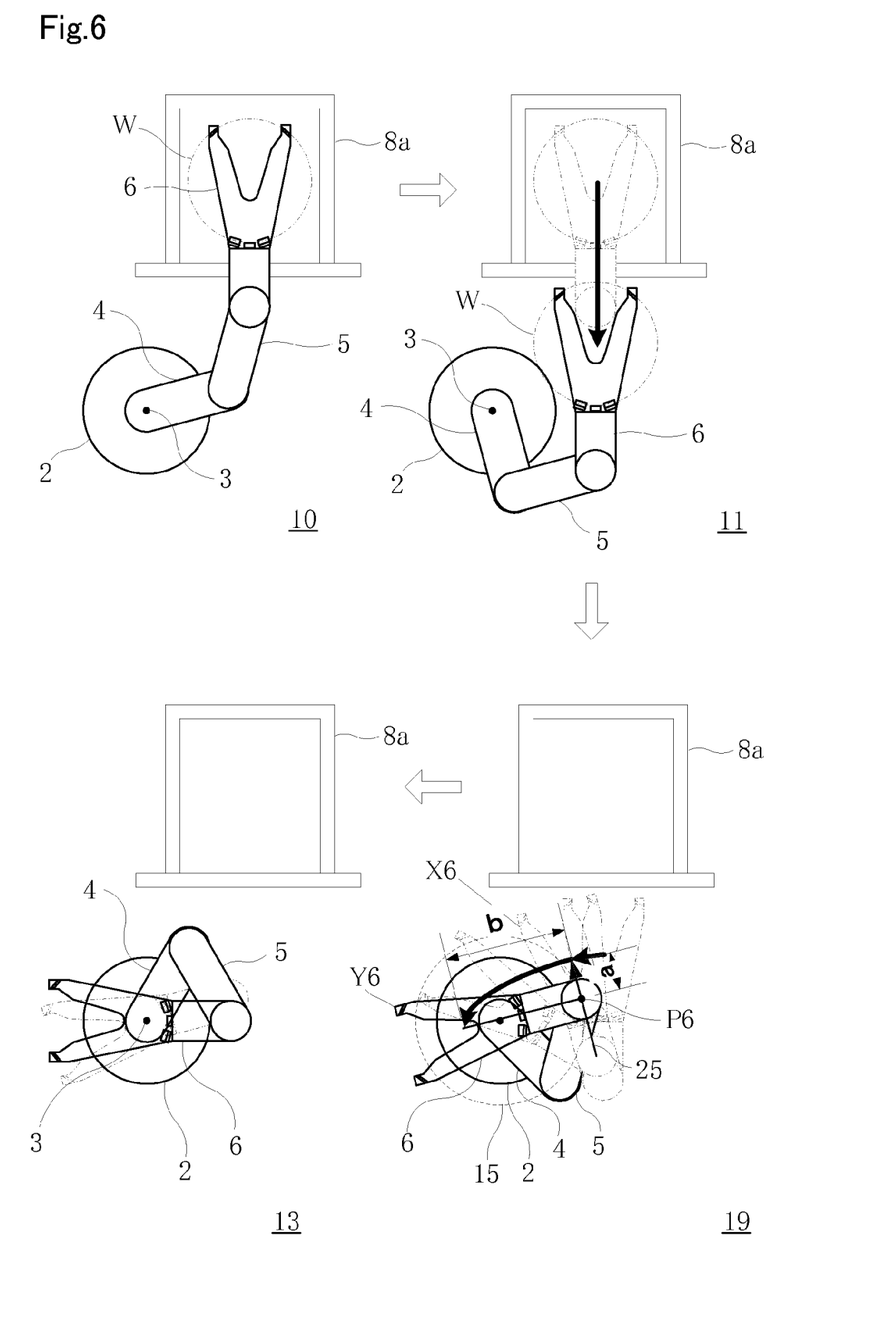
FIG. 6 shows a fourth substrate transfer route between the taught position and the origin position.
Figure 11:
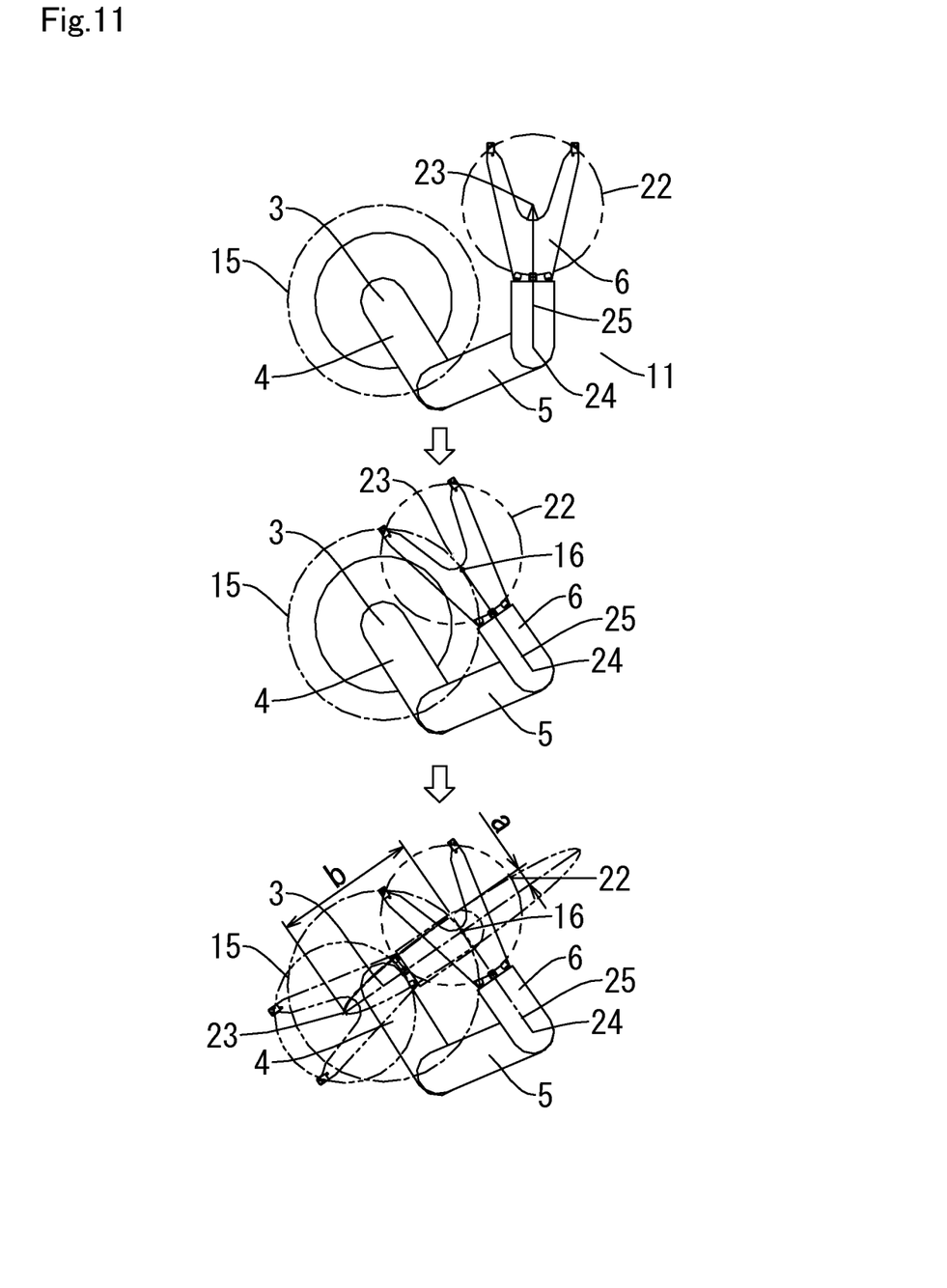
FIG. 11 is a detailed view of the fourth transfer route between the taught position and the origin position.

Regarding a fourth transfer route, as shown in FIG. 6, the substrate gripping portion 6 is first turned (a posture X6 in FIG. 6) from the access standby position 11 in a direction such that the substrate-gripping-portion vector 25 or an extension line thereof comes into contact with the locus 15 of the substrate-gripping-portion turn center 24 made when the substrate gripping portion 6 is turned in the minimum turning posture. Next, the substrate center 23 is moved toward a posture (Y6 in FIG. 6) where the substrate-gripping-portion vector 25 intersects the substrate-gripping-portion vector 25 in the posture X6 and the substrate-gripping-portion turn center 24 is on the substrate-gripping-portion vector 25 in the posture X6. In this case, the substrate center 23 moves along an ellipse that is centered on a contact point P6 between the substrate-gripping-portion vector 25 and the locus 15. The ellipse has a short axis having a length equal to double a distance a (=(a distance from the substrate-gripping-portion turn center 24 to the substrate center 23 in the posture X6)−(a distance from the substrate-gripping-portion turn center 24 to the contact point P6 in the posture X6)), and a long axis having a length equal to a distance b (a distance from the substrate-gripping-portion turn center 24 to the substrate center 23 in the posture Y6). Moreover, the substrate-gripping-portion turn center 24 moves along the substrate-gripping-portion vector 25 in the posture X6, whereby the substrate gripping portion 6 moves to the minimum-turning posture (referred to as a minimum-turning D-posture 19). For easier understanding, FIG. 11 shows the above-described movement. In FIG. 11, a heavy line portion of an eclipse shows a route actually followed by the substrate center 23.

While the four routes are the same in information about the taught position 10 and the transit point (access standby position 11), but are different in the moving route from the access standby position 11 to the minimum turning posture.

When the treatment device 9a, the treatment device 9b, or the storage container 8b shown in FIG. 2 is taught, the above-described transfer-route generating function similarly generates an access standby position for the taught position, and generates a plurality of transfer routes from the access standby position to the minimum turning posture.

Of course, a plurality of transfer routes are sometimes not generated according to the taught position.

In actuality, generation of a plurality of transfer routes corresponding to each taught position may be enabled or disabled according to a parameter for the taught position. This can limit selectable routes from which the shortest route is selected, as will be described below.

Next, a description will be given of a further transfer-route generating function of the embodiment. According to the further transfer-route generating function, another transfer route is generated in addition to the above-described transfer route that provides the minimum turning posture in the following condition.

Figure 7:
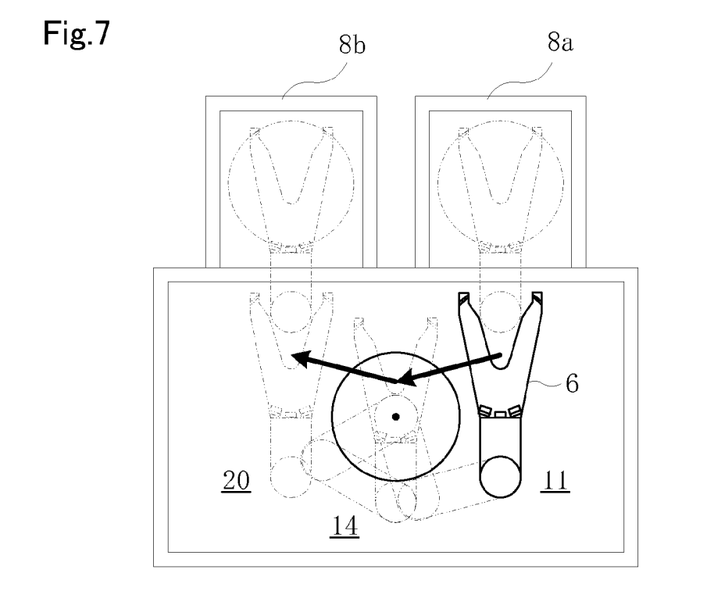
FIG. 7 shows a first transfer route from a first storage container to a second storage container.

FIG. 7 shows a transfer route from one storage container 8a to the other storage container 8b. As shown in FIG. 7, the storage containers 8a and 8b are juxtaposed on the same side of the turn center 3 of the substrate transfer robot 1. When the substrate transfer robot 1 accesses the storage containers 8a and 8b, vectors from the turn center of the substrate gripping portion 6 to the leading end are in substantially parallel. That is, the substrate gripping portion 6 points toward the same direction at access standby positions. When instructions to move the robot from the storage container 8a to the storage container 8b are given to the controller by programming, the controller can, of course, first select a transfer route passing through the minimum turning A-, B-, C-, or D-posture shown in FIGS. 3 to 6. For example, the transfer route shown in FIG. 7 is selected. The transfer route shown in FIG. 7 includes the transfer route shown in FIG. 4 such as to reach the storage container 8b via the minimum-turning B-posture 14. When the transfer route includes the transfer route shown in FIG. 3, 5, or 6, the substrate gripping portion 6 needs to turn to the minimum-turning B-posture 14 via the minimum-turning A-, C-, or D-posture 12, 18, or 19. This increases the transfer time. Thus, the transfer route shown in FIG. 4 is selected in this case.

Figure 8:
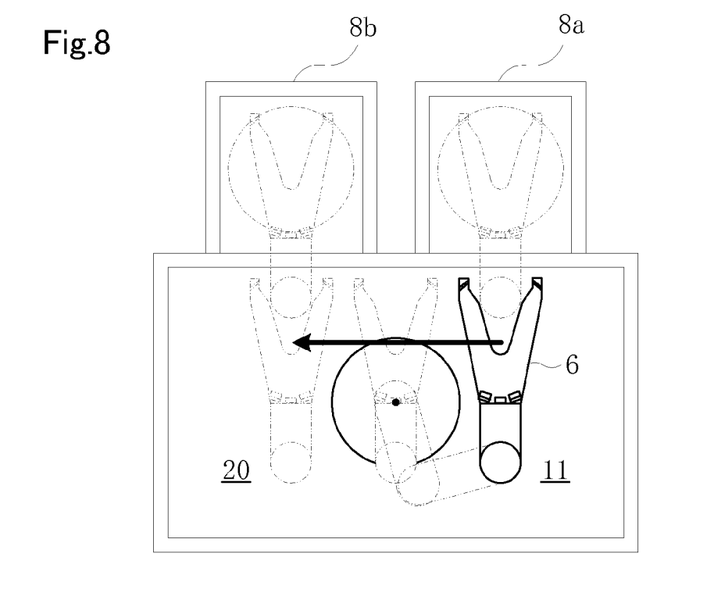
FIG. 8 shows a second transfer route from the first storage container to the second storage container.

However, it is found from FIG. 7 that the moving distance can be shortened by directly moving the substrate gripping portion 6 from the access standby position 11 to an access standby position 20 of a target position (storage container 8b) without passing through the minimum-turning B-position 14. In such a case in which a safe transfer route can be ensured, the controller permits direct movement from the access standby position 11 of the storage container 8a to the access standby position 20 of the storage container 8b at the target position, and generates the transfer route of direct movement as a new transfer route. FIG. 8 shows the generated transfer route. In contrast to the transfer route shown in FIG. 7, the transfer route shown in FIG. 8 is such that the substrate gripping portion 6 moves from the access standby position 11 to the access standby position 20 while maintaining its vector direction from the turn center to the leading end of the substrate gripping portion 6 without passing through the minimum-turning B-posture 14.

Figure 9:
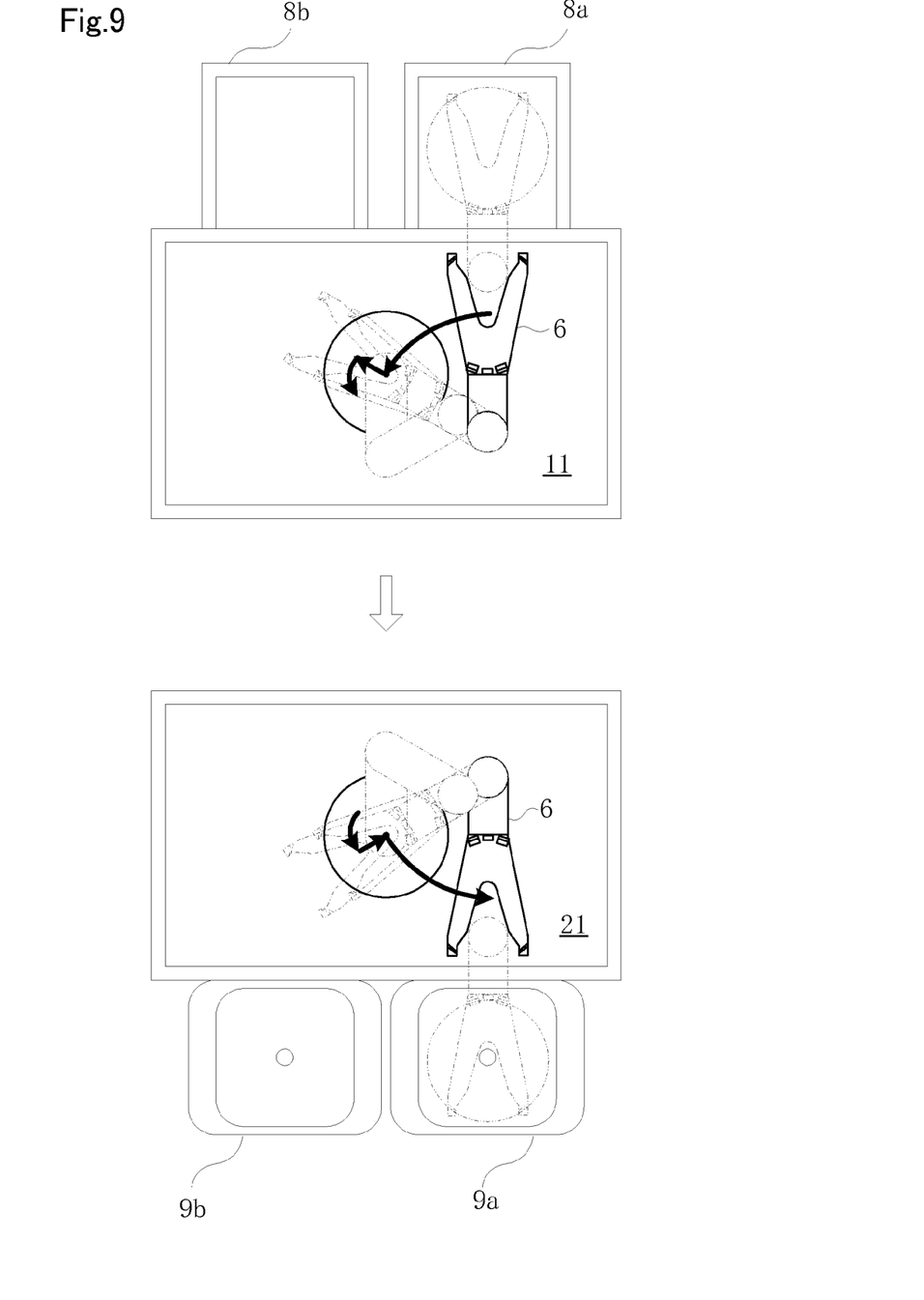
FIG. 9 shows a first transfer route from the first storage container to a treatment device.

FIG. 9 shows a transfer route from the storage container 8a to the treatment device 9a. As shown in FIG. 9, the storage container 8a and the treatment device 9a oppose each other with the turn center 3 of the substrate transfer robot 1 being disposed therebetween. When instructions to move the substrate transfer robot 1 from the storage container 8a to the treatment device 9a are given to the controller by programming, the controller can first select a transfer route passing through the minimum-turning A-, B-, C-, or D-posture shown in FIGS. 3 to 6. For example, the controller can select the transfer route shown in FIG. 9. The transfer route shown in FIG. 9 includes the transfer route shown in FIG. 3, and reaches the treatment device 9a via the minimum-turning A-posture 12.

Figure 10:
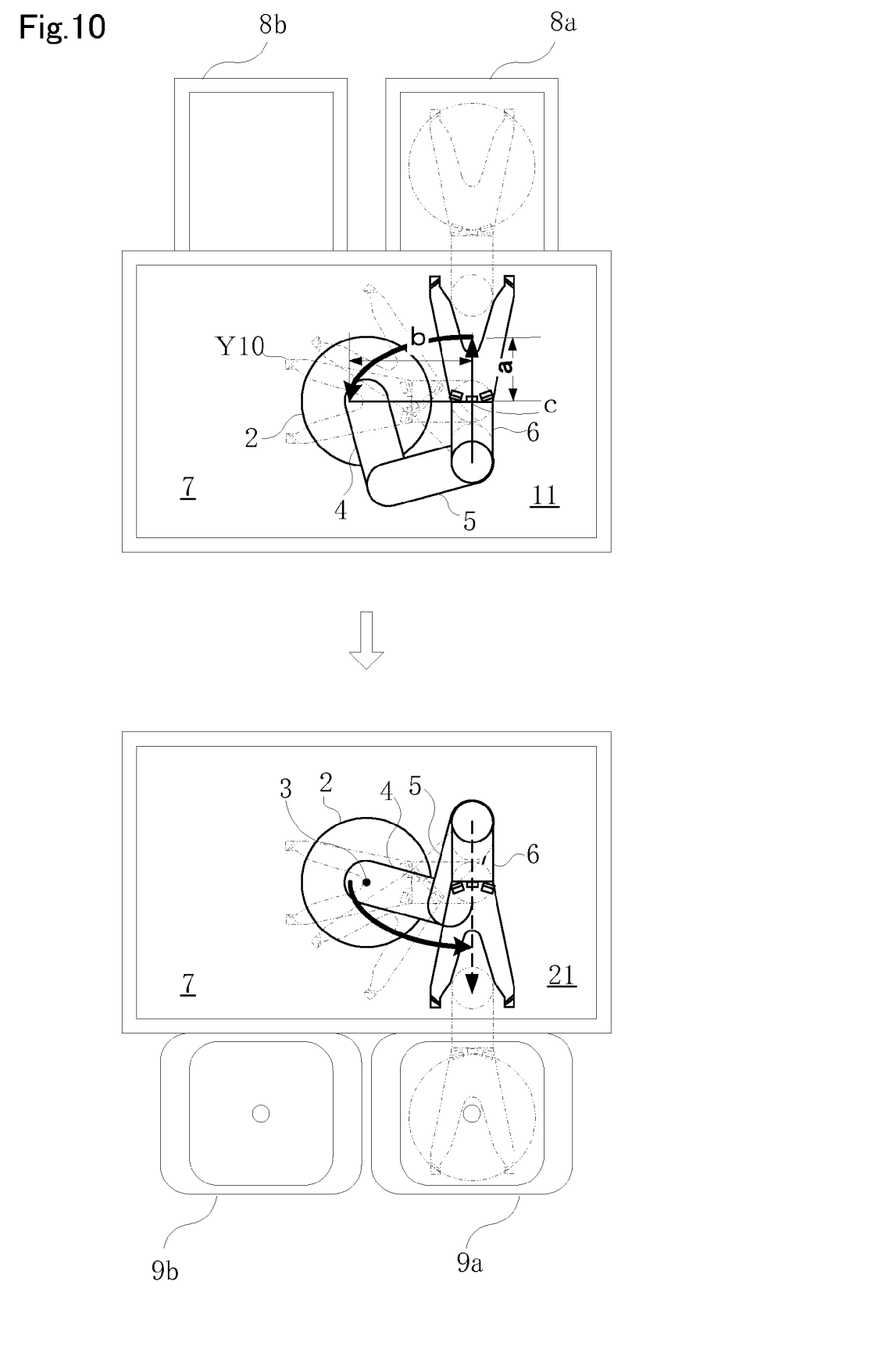
FIG. 10 shows a second transfer route from the first storage container to the treatment device.

However, it is found from FIG. 9 that the moving distance can be shortened by moving the substrate gripping portion 6 to an access standby position 21 serving as a target position without passing through the minimum-turning A-position 12. Accordingly, a transfer route shown in FIG. 10 is generated in this case. The transfer route shown in FIG. 10 is such that the substrate gripping portion 6 directly moves from the access standby position 11 for the storage container 8a to the access standby position 21 for the treatment device 9a without passing through the minimum-turning A-position 12. More specifically, the substrate-gripping-portion turn center 24 moves along the substrate-gripping-portion vector 25 at the access standby position 11, and simultaneously, the substrate gripping portion 6 turns toward a posture such that the substrate-gripping-portion vector 25 is at right angles to the substrate-gripping-portion vector 25 at the access standby position 11 and passes through the turn center 3, that is, a posture Y10 in FIG. 10. In this case, the turn center 23 moves along an ellipse centered on an intersection point c of the substrate-gripping-portion vectors 25 at the access standby position 11 and in the posture Y10. The ellipse has a long axis having a length equal to double the distance b from the substrate-gripping-portion turn center 24 to the substrate center 23 in the posture Y10, and a short axis having a length equal to double the distance a from the intersection point c to the substrate center 23 at the access standby position 11. Then, in the posture Y10, the substrate gripping portion 6 further moves from the posture pointing toward the storage container 8a to a posture pointing in the opposite direction, that is, to the access standby position 21 for the treatment device 9a while the substrate-gripping-portion center 24 passes over the substrate-gripping-portion vector 25 at the access standby position 11 and the substrate center 23 passes over the ellipse. The length and transfer time of the transfer route shown in FIG. 10 are shorter than those in FIG. 9.

When the safe transfer route can be ensured in this way, the controller permits direct movement from the access standby position 11 for the storage container 8a to the access standby position 21 for the treatment device 9a serving as the target position, and generates the transfer route of direct movement as a new transfer route.

Next, a shortest-route selecting function of the embodiment will be described.

The shortest-route selecting function selects a transfer route that provides the shortest time of transfer from a certain position to a target position. When a taught position, such as the storage container 8a or 8b and the treatment device 9a or 9b, is taught, a plurality of transfer routes from the taught position to the minimum turning posture are generated, as described above. For this reason, in the transfer routes from the taught position 10 to the origin position 13 serving as the target position shown in FIGS. 3 to 6, the controller can calculate beforehand the moving time from the taught position 10 to the access standby position 11, the moving time from the access standby position 11 to the minimum-turning A-, B-, C-, or D-posture 12, 14, 18, or 19, and the moving time from the minimum-turning A-, B-, C-, or D-posture 12, 14, 18, or 19 to the origin position 13. The transfer times to reach the target position by the routes can be calculated from the sum of the moving times in these areas, and the shortest route is selected by comparing the transfer times. The shortest one of the transfer routes shown in FIGS. 3 to 6 differs according to the turning speeds and operation amounts in the areas of the arms 4 and 5 and the substrate gripping portion 6 in the substrate transfer robot 1. Hence, in actual operation of the robot, the moving time is calculated every time the robot moves from the certain taught position to the target position, and the calculated moving times are compared.

The above-described transfer routes (transfer routes shown in FIGS. 8 and 10 that do not pass through the minimum turning posture) are included in candidate routes to be automatically selected as the shortest route. When it is determined by comparison that any of the transfer routes shown in FIGS. 8 and 10 provides the shortest transfer time, the substrate transfer robot 1 operates by the transfer route.

According to the embodiment, since the access standby position is automatically generated for the taught position and a plurality of transfer routes to the minimum turning posture are generated and are stored in the controller, it is possible to select an arbitrary route when transfer from the taught position to the other target position is programmed.

When a transfer program from the first taught position to the second taught position, where the substrate gripping portion assumes the same posture, is selected, if it can be confirmed that the substrate can be linearly transferred between the access standby positions for the taught positions without passing through the minimum turning posture, this linear route is further stored as a transfer route. This can increase the number of choices of routes.

Since the transfer times on the generated transfer routes are calculated and compared, a transfer route that provides the shortest transfer time can be selected.

Further, the throughput of substrate transfer can be improved in the substrate transfer device or the semiconductor manufacturing apparatus.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A substrate transfer robot comprising:
    a substrate gripping portion configured to hold a substrate;
    an arm unit including a plurality of arms which are capable of turning in a horizontal plane, the arm unit having the substrate gripping portion at a leading end of the arm unit and being configured to transfer the substrate between a plurality of taught positions taught beforehand; and
    a controller, when the taught positions are taught, configured to generate an access standby position corresponding to each of the plurality of taught positions and configured to generate and store a plurality of routes from the access standby position to a minimum turning posture of the substrate transfer robot,
    wherein, when a first taught position and a second taught position are taught, the controller generates a first access standby position corresponding to the first taught position and a second access standby position corresponding to the second taught position, and generates and stores a first route from the first access standby position to the minimum turning posture and a second route from the second access standby position to the minimum turning posture, the first access standby position comprising a position from which the substrate gripping portion can linearly carry the substrate to the first taught position, the second access standby position comprising a position from which the substrate gripping portion can linearly carry the substrate to the second taught position,
    wherein, when instructions to transfer the substrate from the first taught position to the second taught position are given, and when a first vector from a turn center of the substrate gripping portion to a leading end of the substrate gripping portion at the first taught position is substantially parallel to a second vector from the turn center of the substrate gripping portion to the leading end of the substrate gripping portion at the second taught position, the controller determines whether or not the substrate can be linearly transferred from the first access standby position for the first taught position to the second access standby position for the second taught position, and wherein, when it is determined that the substrate can be linearly transferred from the first access standby position to the second access standby position, the controller generates and stores a third route linearly connecting the first access standby position to the second access standby position, and selects the third route instead of the first route and the second route to transfer the substrate from the first taught position to the second taught position.

2. The substrate transfer robot according to claim 1, wherein one of the plurality of routes from the access standby position to the minimum turning posture of the substrate transfer robot allows movement to the minimum turning posture while maintaining a vector direction of a straight line connecting a turn center of the substrate transfer robot and the turn center of the substrate gripping portion.

3. The substrate transfer robot according to claim 1, wherein one of the plurality of routes from the access standby position to the minimum turning posture of the substrate transfer robot allows movement to the minimum turning posture while maintaining a vector direction from a turn center of the substrate gripping portion to the leading end of the substrate gripping portion.

4. The substrate transfer robot according to claim 1, wherein one of the plurality of routes from the access standby position to the minimum turning posture of the substrate transfer robot is such that the turn center of the substrate gripping portion moves along a straight line passing through the turn center of the substrate gripping portion and being in contact with a locus of the turn center of the substrate gripping portion made when the substrate transfer robot turns in the minimum turning posture, and such that the substrate gripping portion moves to the minimum turning posture.

5. The substrate transfer robot according to claim 1, wherein one of the plurality of routes from the access standby position to the minimum turning posture of the substrate transfer robot is such that the substrate gripping portion is turned until a vector from the turn center of the substrate gripping portion to the leading end of the substrate gripping portion comes into contact with a locus of the turn center of the substrate gripping portion made when the substrate transfer robot turns in the minimum turning posture, and such that a center of the substrate gripped by the substrate gripping portion moves to the minimum turning posture while traveling along an elliptic locus.

6. A substrate transfer robot comprising:
a substrate gripping portion configured to hold a substrate;
an arm unit including a plurality of arms which are capable of turning in a horizontal plane, the arm unit having the substrate gripping portion at a leading end of the arm unit and being configured to transfer the substrate between a plurality of taught positions taught beforehand; and
a controller, when the taught positions are taught, configured to generate an access standby position corresponding to each of the plurality of taught positions and configured to generate and store a plurality of routes from the access standby position to a minimum turning posture of the substrate transfer robot, wherein, when a first taught position and a second taught position are taught, the controller generates a first access standby position corresponding to the first taught position and a second access standby position corresponding to the second taught position, and generates and stores a first route from the first access standby position to the minimum turning posture and a second route from the second access standby position to the minimum turning posture, the first access standby position comprising a position from which the substrate gripping portion can linearly carry the substrate to the first taught position, the second access standby position comprising a position from which the substrate gripping portion can linearly carry the substrate to the second taught position, wherein, when instructions to transfer the substrate from the first taught position to the second taught position are given, and when a first vector from a turn center of the substrate gripping portion to a leading end of the substrate gripping portion at the first taught position is opposite to a second vector from the turn center of the substrate gripping portion to the leading end of the substrate gripping portion at the second taught position, the controller determines whether or not the substrate gripped by the substrate gripping portion can be transferred from the first access standby position to the second access standby position so that the turn center of the substrate ripping portion moves along a straight line connecting the first access standby position for the first taught position to the second access standby position for the second taught position and so that a center of the substrate moves along an elliptic arc locus, and wherein, when it is determined that the substrate can be transferred from the first access standby position to the second access standby position so that the turn center of the substrate gripping portion moves along the straight line and so that the center of the substrate moves along the elliptic arc locus, the controller generates and stores a third route connecting the first access standby position to the second access standby position so that the turn center of the substrate gripping portion moves along the straight line and so that the center of the substrate moves along the elliptic arc locus, and selects the third route instead of the first route and the second route to transfer the substrate from the first taught position to the second taught position.

7. The substrate transfer robot according to claim 1, wherein the controller is configured to calculate transfer times along the plurality of routes.

8. The substrate transfer robot according to claim 7, wherein the controller is configured to compare the transfer times along the plurality of routes, and select one of the plurality of routes that provides a shortest transfer time.

9. The substrate transfer robot according to claim 1, wherein the controller is configured to calculate transfer times along the plurality of routes and a transfer time along the route of the linear transfer.

10. The substrate transfer robot according to claim 6, wherein the controller is configured to calculate transfer times along the plurality of routes and a transfer time along the route of the transfer on the elliptic arc locus.

11. The substrate transfer robot according to claim 9, wherein the controller is configured to compare the transfer times along the plurality of routes and the transfer time along the route of the linear transfer, and select a route that provides shortest transfer time.

12. The substrate transfer robot according to claim 10, wherein the controller is configured to compare the transfer times along the plurality of routes and the transfer time along the route of the transfer along the elliptic arc locus.

13. A substrate transfer device comprising:
a substrate transfer robot comprising:
a substrate gripping portion configured to hold a substrate;
an arm unit including a plurality of arms which are capable of turning in a horizontal plane, the arm unit having the substrate gripping portion at a leading end of the arm unit and being configured to transfer the substrate between a plurality of taught positions taught beforehand; and
a controller, when the taught positions are taught, configured to generate an access standby position corresponding to each of the plurality of taught positions and configured to generate and store a plurality of routes from the access standby position to a minimum turning posture of the substrate transfer robot; and
at least two substrate storage containers configured to store the substrate and including a first substrate storage container and a second substrate storage container,
wherein positions of the at least two substrate storage containers are taught as the taught positions, and the substrate is transferred between the at least two substrate storage containers,
wherein, when a first taught position defined in the first substrate storage container and a second taught position defined in the second substrate storage container are taught, the controller generates a first access standby position corresponding to the first taught position and a second access standby position corresponding to the second taught position, and generates and stores a first route from the first access standby position to the minimum turning posture and a second route from the second access standby position to the minimum turning posture, the first access standby position comprising a position from which the substrate gripping portion can linearly carry the substrate to the first taught position, the second access standby position comprising a position from which the substrate gripping portion can linearly carry the substrate to the second taught position,
wherein, when instructions to transfer the substrate from the first taught position to the second taught position are given, and when a first vector from a turn center of the substrate gripping portion to a leading end of the substrate gripping portion at the first taught position is substantially parallel to a second vector from the turn center of the substrate gripping portion to the leading end of the substrate gripping portion at the second taught position, the controller determines whether or not the substrate can be linearly transferred from the first access standby position for the first taught position to the second access standby position for the second taught position, and
wherein, when it is determined that the substrate can be linearly transferred from the first access standby position to the second access standby position, the controller generates and stores a third route linearly connecting the first access standby position to the second access standby position, and selects the third route instead of the first route and the second route to transfer the substrate from the first taught position to the second taught position.

14. A semiconductor manufacturing apparatus comprising:
a substrate transfer robot comprising:
a substrate gripping portion configured to hold a substrate;
an arm unit including a plurality of arms which are capable of turning in a horizontal plane, the arm unit having the substrate gripping portion at a leading end of the arm unit and being configured to transfer the substrate between a plurality of taught positions taught beforehand; and
a controller, when the taught positions are taught, configured to generate an access standby position corresponding to each of the plurality of taught positions and configured to generate and store a plurality of routes from the access standby position to a minimum turning posture of the substrate transfer robot; and
at least one substrate storage container configured to store the substrate and including a first substrate storage container and a second substrate storage container; and
at least one treatment device configured to treat the substrate,
wherein positions of the at least one substrate storage container and the at least one treatment device are taught as the taught positions, and the substrate is transferred between the at least one substrate storage container and the at least one treatment device,
wherein, when a first taught position defined in the first substrate storage container and a second taught position defined in the second substrate storage container are taught, the controller generates a first access standby position corresponding to the first taught position and a second access standby position corresponding to the second taught position, and generates and stores a first route from the first access standby position to the minimum turning posture and a second route from the second access standby position to the minimum turning posture, the first access standby position comprising a position from which the substrate gripping portion can linearly carry the substrate to the first taught position, the second access standby position comprising a position from which the substrate gripping portion can linearly carry the substrate to the second taught position,
wherein, when instructions to transfer the substrate from the first taught position to the second taught position are given, and when a first vector from a turn center of the substrate gripping portion to a leading end of the substrate gripping portion at the first taught position is substantially parallel to a second vector from the turn center of the substrate gripping portion to the leading end of the substrate gripping portion at the second taught position, the controller determines whether or not the substrate can be linearly transferred from the first access standby position for the first taught position to the second access standby position for the second taught position, and
wherein, when it is determined that the substrate can be linearly transferred from the first access standby position to the second access standby position, the controller generates and stores a third route linearly connecting the first access standby position to the second access standby position, and selects the third route instead of the first route and the second route to transfer the substrate from the first taught position to the second taught position.

15. A method for producing a semiconductor device, comprising:
holding a substrate with a substrate gripping portion of a substrate transfer robot;
transferring the substrate between a plurality of taught positions taught beforehand;

generating an access standby position corresponding to each of the plurality of taught positions when the taught positions are taught; and generating a plurality of routes from the access standby position to a minimum turning posture of the substrate transfer robot, wherein, in the generating of the access standby position, when a first taught position and a second taught position are taught, a first access standby position corresponding to the first taught position and a second access standby position corresponding to the second taught position are generated, and a first route from the first access standby position to the minimum turning posture and a second route from the second access standby position to the minimum turning posture are generated and stored, the first access standby position comprising a position from which the substrate gripping portion can linearly carry the substrate to the first taught position, the second access standby position comprising a position from which the substrate gripping portion can linearly carry the substrate to the second taught position, wherein, when instructions to transfer the substrate from the first taught position to the second taught position are given, and when a first vector from a turn center of the substrate gripping portion to a leading end of the substrate gripping portion at the first taught position is substantially parallel to a second vector from the turn center of the substrate gripping portion to the leading end of the substrate gripping portion at the second taught position, it is determined whether or not the substrate can be linearly transferred from the first access standby position for the first taught position to the second access standby position for the second taught position, and wherein, when it is determined that the substrate can be linearly transferred from the first access standby position to the second access standby position, a third route linearly connecting the first access standby position to the second access standby position is generated and stored, the third route is selected instead of the first route and the second route to transfer the substrate from the first taught position to the second taught position.

16. The substrate transfer robot according to claim 6, wherein one of the plurality of routes from the access standby position to the minimum turning posture of the substrate transfer robot is such that the turn center of the substrate gripping portion moves along a straight line passing through the turn center of the substrate gripping portion and being in contact with a locus of the turn center of the substrate gripping portion made when the substrate transfer robot turns in the minimum turning posture, and such that the substrate gripping portion moves to the minimum turning posture.

17. The substrate transfer robot according to claim 6, wherein one of the plurality of routes from the access standby position to the minimum turning posture of the substrate transfer robot is such that the substrate gripping portion is turned until a vector from the turn center of the substrate gripping portion to the leading end of the substrate gripping portion comes into contact with a locus of the turn center of the substrate gripping portion made when the substrate transfer robot turns in the minimum turning posture, and such that a center of the substrate gripped by the substrate gripping portion moves to the minimum turning posture while traveling along an elliptic locus.

* * * * *